United States Patent [19]

Harms et al.

[11] Patent Number: 4,555,460

[45] Date of Patent: Nov. 26, 1985

[54] MASK FOR THE FORMATION OF PATTERNS IN LACQUER LAYERS BY MEANS OF X-RAY LITHOGRAPHY AND METHOD OF MANUFACTURING SAME

[75] Inventors: Margret Harms, Hamburg; Angelika Bruns, Henstedt-Ulzbur; Holger Luthje, Halstenbek; Bernd Matthiessen, Seevetal, all of Fed. Rep. of Germany

[73] Assignee: U.S. Philips Corporation, New York, N.Y.

[21] Appl. No.: 528,352

[22] Filed: Aug. 31, 1983

[30] Foreign Application Priority Data

Sep. 1, 1982 [DE] Fed. Rep. of Germany ....... 3232498

[51] Int. Cl.[4] .......................... G02B 5/00; G02B 7/00; G03F 1/00
[52] U.S. Cl. ........................................ 430/5; 350/318; 378/35; 430/967
[58] Field of Search .......................... 430/5, 966, 967; 250/505.1, 482.1; 350/318; 378/35

[56] References Cited

U.S. PATENT DOCUMENTS

| | | | |
|---|---|---|---|
| 3,742,230 | 6/1973 | Spears et al. | 430/5 |
| 4,152,601 | 5/1979 | Kadota et al. | 378/35 |
| 4,260,670 | 4/1981 | Burns | 430/5 |
| 4,454,209 | 6/1984 | Blais | 430/5 |

*Primary Examiner*—Richard L. Schilling
*Attorney, Agent, or Firm*—Paul R. Miller

[57] ABSTRACT

In a mask for X-ray lithography, in which a pattern of a layer corresponding to the structure to be manufactured and consisting of a material opaque to visible light is applied to a thin diaphragm of a material transparent to X-ray radiation, an adjustment with visible radiation, such as laser light, is made possible using a diaphragm consisting of a material opaque to visible light and using adjustment windows of a material transparent to the visible light of the spectrum through the diaphragm.

6 Claims, 2 Drawing Figures

MASK FOR THE FORMATION OF PATTERNS IN LACQUER LAYERS BY MEANS OF X-RAY LITHOGRAPHY AND METHOD OF MANUFACTURING SAME

The invention relates to a mask for the formation of patterns in lacquer layers by means of X-ray lithography comprising a diaphragm of metal opaque to visible light and a layer present on one of the major surfaces of the diaphragm, absorbing the X-rays and structured in accordance with the pattern to be formed.

The invention further relates to a method of manufacturing such a mask.

Especially in the manufacture of integrated semiconductor systems, but also in the manufacture of, for example, magnetic cylindrical domain devices, there is a constant demand for increasingly smaller details and the resolution, which is desired at present in the structure and in the mask, approaches the limit imposed by the wave-length of the light. Therefore, methods other than photo-optical methods have already been used to permit of passing to a higher resolution.

The suitability of lithography becomes manifest by the minimum strip width of the structures that can be attained by it: photolithography $\approx 2$ to 3 $\mu$m, electron beam lithography $\approx 0.05$ to 0.1 $\mu$m, X-ray lithography and ion beam lithography $>150$ nm.

All high-resolution methods require accurate and very precisely defined masks. Such masks consist of the pattern of the structure to be manufactured of a material opaque to the lithographic radiation used (designated hereinafter as absorber pattern), the absorber pattern being formed on a thin diaphragm of a material which is as transparent as possible to the lithographic radiation. A few materials, which are used for diaphragms and are particularly suitable with respect to properties required to masks, such as accuracy to size and breaking strength, for example, metals, such as titanium, beryllium or magnesium, are sufficiently transparent to short-wave lithographic radiation, for example, X-ray radiation, it is true, but they are opaque to visible light. This proves to be disadvantageous for the adjustment of such masks, which is effected at present mainly by means of a laser light.

In "Journal of the Electrochemical Society, Solid State Science and Technology", 1981, May, p. 1106–1120 there is described, for example, for a mask for X-ray lithography a titanium diaphragm, for which an indirect adjustment method has been proposed because it is not transparent to visible light. This indirect adjustment method is laborious and can be used only for comparatively large patterns because of the only low degree of accuracy.

The invention has for its object to improve for masks of the kind mentioned in the opening paragraph diaphragms of metal, which are opaque to visible light, in a manner such that they can be adjusted fully automatically and directly by means of laser light. According to the invention, this is achieved in that the diaphragm has adjustment windows of a material transparent to visible light.

According to advantageous embodiments of the invention, the diaphragm consists of titanium and the adjustment windows consist of a synthetic material, such as polyimide. Since polyimides exist both as synthetic resins and as semi-manufactured articles, such as foils, processing possibilities are obtained which can be adapted variably to the instantaneous practical requirements.

According to a first group of methods, a diaphragms can be coated with a synthetic material in the form of a synthetic resin, for example, polyimide, as the material for the adjustment windows. This involves the advantage that the properties of the diaphragm can be first adjusted in accordance with the various desired practical requirements by adaptable manufacturing methods for the diaphragm before the layer of synthetic resin is applied to it.

However, according to a second group of methods, the starting material may alternatively be a semi-manufacture article in the form of a commercially available foil of a synthetic material, for example, polyimide, which is coated with the material for forming the diaphragm, for example, by cathode sputtering. This process involves the advantage that a series of processing steps can be economized, which are necessary for joining together the diaphragm and the synthetic material when a liquid synthetic resin is processed. The use of the synthetic material in the form of synthetic resin or in the form of a foil can thus be chosen to the optimum in accordance with various practical requirements.

The advantages obtained with the invention especially consist in that as diaphragm for a mask of the kind mentioned in the opening paragraph use can be made of a metal diaphragm, which has a high breaking strength, but which is also stable, for example, with respect to X-rays, whereby a direct fully automatic adjustment can be effected by means of laser light, which was not possible with metal diaphragms hitherto. A particular advantage is that with the methods according to the invention of manufacturing the mask an extremely high accuracy of the positions of the adjustment figures can be attained while at the same time the size of the adjustment windows is minimized.

Embodiments of the mask according to the invention and of the methods according to the invention of manufacturing such a mask will be described and its operation will be explained with reference to the drawing. In the drawing.

Figure 1:
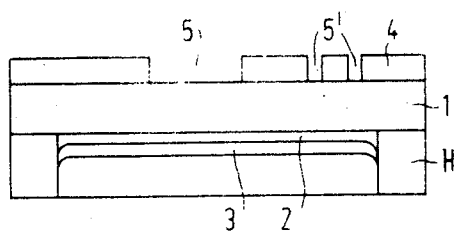
FIGS. 1a to 1c show in sectional view a mask with adjustment windows according to the invention in a few stages of its manufacture.
Figure 1:
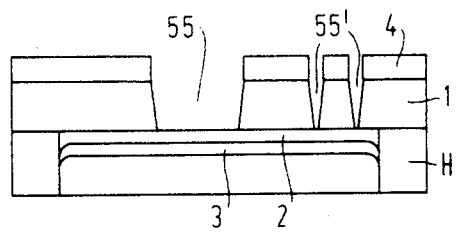
Figure 1:
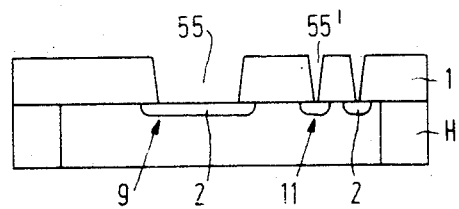
Figure 2:
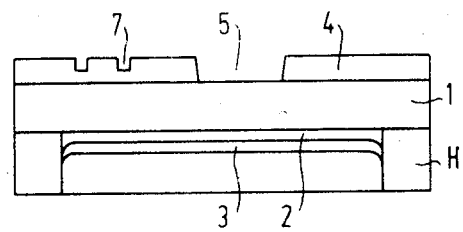
FIGS. 2a to 2c show in sectional view a mask with adjustment windows and adjustment depressions according to the invention in a few stages of its manufacture.
Figure 2:
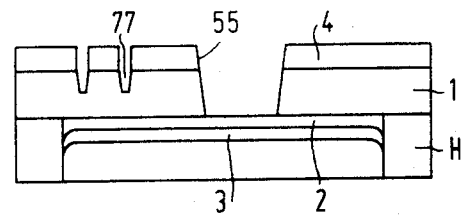
Figure 2:
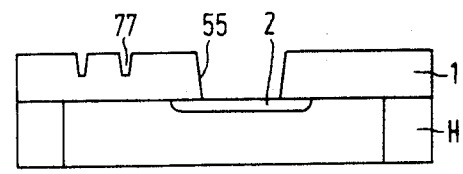

FIGS. 1a to 1c and 2a to 2c each show in sectional view diaphragms 1 of titanium. These diaphragms may have been obtained in different ways. For example, a gold layer poorly adhering to glass may first be applied to a glass substrate, after which a titanium layer is applied to the gold layer by vapour deposition. Subsequently, the diaphragm is pulled together with the gold layer off the glass substrate and is stretched in known manner on a holding frame for further processing.

Favourable results are obtained if the titanium layer is not vapour-deposited, but is applied by a cathode sputtering process to the gold layer present on the glass substrate.

According to another method, the diaphragm may alternatively be formed so that the material of the diaphragm, i.e. titanium, is applied directly to a commercially available polyimide foil which is used in a later processing step for forming the adjustment windows.

This application may be effected, for example, also by cathode sputtering.

Method A

A diaphragm 1, which, as described above, is obtained by cathode sputtering on a glass substrate, is pulled off and is stretched on a holding frame H, is further processed in accordance with FIGS. 1a to 1c as follows:

A polyimide layer 2 having a thickness of about 0.5μm is first applied to one of the major surfaces of the diaphragm 1 of titanium by centrifuging. It is efficacious to stabilize this polyimide layer; this may be effected by a tempering process for 4 hours at a temperture of about 200° C.

A layer 3 having a thickness of about 0.5μm and consisting of a negatively working UV-sensitive photolacquer is then applied to the polyimide layer 2. A layer 4 having a thickness of about 1.3μm and consisting of a positively working photolacquer is applied to the other major surface of the diaphragm 1. Both photolacquer layers 3, 4 are subsequently stabilized by a tempering process for 0.5 hours at a temperature of about 90° C.

The positively working photolacquer layer 4 is then exposed in accordance with the pattern for the adjustment windows to be formed therein. In the example shown in FIG. 1a, an opening 5 and several smaller openings 5' were provided in the photolacquer layer 4.

Through the openings 5 and 5' provided in the photolacquer layer 4, the diaphragm 1 of titanium located under the photolacquer layer 4 may be etched for forming adjustment windows 55, 55' in a subsequent processing step. This may be effected, for example, by a wet-chemical etching process. A suitable etching solution consists of a solution having a ratio of 0.6 HF:2.4 $HNO_3$:96 $H_2O$:1 $H_2O_2$.

The diaphragm 1 may alternatively be etched by means of a reactive ion etching process using the following parameters:

HF generator: 27.5 MHz;
Electrode diameter: 200 mm;
Potential at the cathode: 30 V;
Working pressure of the gas atmosphere: $CCl_4$=3.9 Pa.

Instead of a reactive ion etching process, for example, a plasma etching process may also be carried out.

Thus, the structure shown in FIG. 1b can be obtained.

The smaller adjustment windows 55' may be used as adjustment figures for an electron beam writer to be utilized in a later processing step. By means of the adjustment windows 55' the position of the adjustment and absorber figures of the mask to be applied later may be defined exactly with respect to the adjustment windows 55 for an X-ray exposure so that a maximum extent of utilization of the surface area of the substrates to be exposed through the mask is guaraneed.

Through the adjustment windows 55 and 55' formed in the diaphragm 1 in the manner described above, the photolacquer layer 3 of negatively working photolacquer located under the layer 2 transparent to visible light is exposed to ultraviolet radiation and is cross-linked at these areas. The diaphragm then acts as a self-adjusting mask. The negatively working photolacquer is also cross-linked during the exposure the UV radiation in a shadow range defined by the thickness of the layer 2 transparent to visible light and by the distance from the UV radiation source. Subsequently, the photolacquer layer 3 is developed. In a next processing step, the layer 2 transparent to visible light is removed by reactive ion etching under the action of oxygen at the areas which are not covered by the remaining photolacquer layer 3, whereby an $O_2$ atmosphere may be advantageously used. After this etching step, islands 9, 11 of the layer 2 transparent to visible light are left under the adjustment windows 55, 55' (see FIG. 1c). The islands 9, 11 of the polyimide layer 2 transparent to visible light located under the adjustment windows 55, 55' are then exposed to a synchrotron radiation in a dose which is about a factor 12 larger than that required for the exposure of conventionally used PMMA lacquer. The exposure to synchrotron radiation is efficacious to stabilize the polyimide with respect to X-ray radiation.

After the parts of the photolacquer layer 4 located beside the openings 5 and 5' for the adjustment windows have been removed, the desired absorber pattern is formed on the diaphragm 1. The method of producing the absorber pattern will be described further below.

Method B

According to a modified method of manufacturing the mask in accordance with the invention, the polyimide layer 2, the photolcquer layer 3 of negatively working photolacquer and the photolacquer layer 4 of positively working photolacquer are applied to the diaphragm 1 of titanium, which is stretched on the holding H, in the manner described above (see FIGS. 2a to 2c).

However, the openings 5 and openings 7 are not provided in the photolacquer layer 4 by a photolithographic process, but by an electron beam lithographic process. The procedure is then such that the photolacquer layer 4 is exposed to an electron beam, which is given at the area of the openings 7 to be formed a current density which is reduced by about 60% with respect to the full current density for the exposure of the areas of the photolacquer layer 4 at which the openings 5 are to be formed. Thus, only half the layer thickness of the photolacquer is removed at the areas less strongly exposed during the subsequent development.

After the exposed parts of the photolacquer layer 4 have been removed, an etching process for the titanium diaphragm 1 is carried out, as it has been described for method a. In this case, the adjustment windows 55 are completely etched through, whereas the adjustment depressions 77 are etched only half-way.

The further processing steps for manufacturing the mask are effected in a manner analogous to the processing steps described for method A.

Method C

According to a further embodiment of the method of manufacturing the mask in accordance with the invention, the procedure is such that, as described for methods A and B the layer 2 of material transparent to visible light, in this case polyimide, is applied in the manner described above to one major surface of the diaphragm 1 of titanium, which is stretched on a holding frame H, and is stabilized for a duration of 4 hours by tempering at a temperature of 200° C. Subsequently, in contrast with the methods A and B describes above, only the positively working photolacquer layer 4 is applied to the other major surface of the diaphragm 1; a negatively working photolacquer layer is not applied in this case. The positively working photolacquer layer 4 is also stabilized, as described above, by tempering at a temperature of about 90° C. for a duration of about 0.5 hours.

By means of a photolithographic process, the photolacquer layer 4 is exposed at the areas of the adjustment windows to be provided, after which the adjustment windows 55, 55' are etched into the diaphragm 1 by means of a plasma etching or by means of a reactive ion etching, as described for method a.

After this etching step, the whole layer 2 of material transparent to visible light, in this case polyimide, is stabilized by means of a synchrotron radiation, as described for method A. In the method described here, no mutually separated polyimide islands located under the adjustment windows are consequently formed, but the whole polyimide layer under the diaphragm is maintained.

After the positively working photolacquer layer 4 has been removed from the diaphragm 1, the desired absorber pattern, as described further below, is formed on this diaphragm.

Method D

In deviation from the methods A to C described above, the mask according to the invention may alternatively be manufactured so that the material of the diaphragm 1, in this case titanium, is applied to a polyimide foil commercially available as a semi-manufactured article as the layer 2 transparent to visible light by cathode sputtering by means of the method already described above. In further processing steps, a photolacquer layer 3 of negatively working photolacquer is applied to the polyimide foil and a photolacquer layer 4 of positively working photolacquer is applied to the titanium layer constituting the diaphragm 1. Subsequently, both photolacquer layers 3 and 4 are stabilized by a tempering process at a temperature of about 90° C. for about 30 minutes.

The photolacquer layer 4 of positively working photolacquer is exposed through a mask at the area of the adjustment windows to be provided to UV radiation and the exposed parts are then removed for providing the openings 5, 5' for the adjustment windows 55, 55'. By a subsequent etching process, the adjustment windows 55, 55' are opened in the diaphragm 1 constituted by the titanium layer. In this case, the etching process described for method A may be used. The diaphragm 1 is then completely etched at all adjustment windows areas.

Subsequently, the photolacquer layer 3 of negatively working photolacquer is exposed through the adjustment windows 55, 55' in the manner already described for method A to diverging UV radiation and is thus cross-linked. . The parts of the photolacquer layer which are not cross-linked are developed. The parts of the polyimide foil located outside the adjustment windows may then be etched by a reactive ion etching process in the manner described for method A.

The polyimide islands left under the adjustment windows 55, 55' are then also stabilized, as described for method A.

After the positively working photolacquer layer 4 has been removed from the carrier diaphragm 1, the desired absorber pattern is formed on this diaphragm by means of the processing steps to be described further below.

Method E

In deviation from the method D described above, with the use of a polyimide foil commercially available as a semi-manufactured article, to which the titanium layer constituting the diaphragm 1 is applied, adjustment windows 55 are provided, as described for method B, in the form of titanium layer parts completely etched through. At the same time, adjustment depressions 77 are formed, which are present in the form of titanium layer parts which are etched only over half its layer thickness.

The adjustment depressions 77 in the titanium layer constituting the diaphragm 1 etched only over half the layer thickness are used if the absorber pattern should be produced by means of an electron beam writer. The adjustment depression serve as reference markers for the electron beam in order that the position of the adjustment markers to be formed later in the adjustment windows is exactly defined with respect to the adjustment windows.

The adjustment depressions not completely etched through have the advantage that they can serve on the one hand as adjustment auxiliary means for an electron beam, whereas on the other hand the diaphragm remains comparatively stable because the depressions are not continuous.

In the manufacture of such a mask, in a manner analogous to that of the methods B and D, the procedure is such that first a polyimide foil commercially available as a layer 2 transparent to visible light is coated on one of its major surfaces with a titanium layer constituting the diaphragm 1. The titanium layer may, for example, alternatively be applied as a stress-compensated sequence of several layers to the polyimide foil by cathode sputtering. Subsequently, a photolacquer layer 3 of a negatively working photolacquer is applied to the other major surface of the polyimide foil and a photolacquer layer 4 of a positively working photolacquer is applied to the upper side of the titanium layer. Both photolacquer layers are stabilized by a tempering process at a temperature of about 90° C. for a duration of about 30 minutes.

Subsequently, an electron beam lithographic process is carried out for forming the openings 5, 7 in the photolacquer layer 4.

After the etching step for forming the adjustment windows 55 and of the adjustment depressions 77, the photolacquer layer 3 of a negatively working photolacquer present under the polyimide foil is exposed through the fully opened adjustment windows 55 to radiation from a diverging UV radiation source and is then cross-linked. A development process for the photolacquer is then carried out. Subsequently, a plasma or reactive ion beam etching process is carried out, in which the parts of the polyimide foil which are located outside the continuous adjustment windows are etched. The remaining parts of the polyimide layer under the adjustment windows 55 are stabilized, as described for method A.

After the positively working photolacquer layer has been removed from the diaphragm 1, the desired absorber pattern of the mask to be manufctured is produced on this diaphragm.

Multilayer absorber layers, for example of tungsten and molybdenum, have proved to be very suitable for this purpose. To this end, the procedure can be as follows:

Both the tungsten layer and the molybdenum layer are applied by cathode sputtering. The tungsten layer is applied efficaciously with the following parameters:

HF generator: 13.6 MHz;

electrode diameter: 200 mm;
electrode gap: 42 mm;
working pressure of the gas atmosphere: Ar=2 Pa;
Potential at the electrode: 800 V;
Potential at the mask carrier: 40 V.

The molybdenum layer can be applied by cathode sputtering under the following conditions:

HF generator: 13.6 MHz;
electrode diameter: 200 mm;
electrode gap: 42 mm;
working pressure of the gas atmosphere: Ar=2 Pa;
potential at the electrode: 700 V;
potential at the mask carrier: 95 V.

The structure of this absorber layer in accordance with the desired mask pattern can be obtained by means of known techniques, for example, by means of electron beam lithography.

What is claimed is:

1. A mask for producing patterns in lacquer layers by means of X-ray lithography comprising a diaphragm of metal opaque to visible light and transparent to X-radiation, and an absorber pattern layer present on one of the major surfaces of the diaphragm for absorbing the X-ray radiation and structured in accordance with the pattern to be produced, characterized in that the diaphragm has adjustment windows transparent to visible light.

2. A mask for producing patterns in lacquer layers by means of X-ray lithography comprising a diaphragm of titanium opaque to visible light, and an absorber pattern layer present on one of the major surfaces of the diaphragm for absorbing X-ray radiation and structured in accordance with the pattern to be produced, characterized in that the diaphragm has adjustment windows transparent to visible light.

3. A mask as claimed in claim 1, characterized in that the adjustment windows consist of a synthetic material.

4. A mask as claimed in claim 3, characterized in that the adjustment windows consists of a polyimide.

5. A mask according to claim 2, wherein said adjustment windows consist of a synthetic material.

6. A mask according to claim 5, wherein said adjustment windows consist of a polyimide.

* * * * *